United States Patent
Wang et al.

(10) Patent No.: US 12,068,733 B2
(45) Date of Patent: Aug. 20, 2024

(54) FABRICATION METHOD OF FILM BULK ACOUSTIC RESONATOR (FBAR) FILTER DEVICE

(71) Applicant: Shenzhen Newsonic Technologies Co., Ltd., Shenzhen (CN)

(72) Inventors: Jian Wang, Shenzhen (CN); Jie Zou, Shenzhen (CN); Gongbin Tang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/473,670

(22) Filed: Sep. 25, 2023

(65) Prior Publication Data
US 2024/0063768 A1    Feb. 22, 2024

(30) Foreign Application Priority Data
Aug. 2, 2023   (CN) .......................... 202310969496.2

(51) Int. Cl.
*H03H 3/02*     (2006.01)
*H03H 9/17*     (2006.01)
*H03H 9/54*     (2006.01)

(52) U.S. Cl.
CPC .............. *H03H 3/02* (2013.01); *H03H 9/171* (2013.01); *H03H 9/54* (2013.01)

(58) Field of Classification Search
CPC ............. H03H 3/02; H03H 9/171; H03H 9/54
USPC .......................................................... 333/187
See application file for complete search history.

(56) References Cited

U.S. PATENT DOCUMENTS

| | | | | |
|---|---|---|---|---|
| 2011/0121915 A1* | 5/2011 | Miller | .................... | H03H 9/173 29/25.35 |
| 2018/0054176 A1* | 2/2018 | Kim | ........................ | H10N 30/88 |

FOREIGN PATENT DOCUMENTS

JP    3543786 B2 *   7/2004

* cited by examiner

*Primary Examiner* — Hafizur Rahman
(74) *Attorney, Agent, or Firm* — Finnegan, Henderson, Farabow, Garrett & Dunner, LLP.

(57) ABSTRACT

A method for fabricating a film bulk acoustic resonator (FBAR) filter device is provided. The method includes: forming a first electrode of each one of a first resonator and a second resonator on a first surface of a piezoelectric layer, forming a first passivation layer of each one of the first resonator and the second resonator on a corresponding one of the first electrodes, forming a second electrode of each one of the first resonator and the second resonator on a second surface of the piezoelectric layer, conducting a radio frequency (RF) performance test on the FBAR filter device, adjusting a thickness of the second electrode of the first resonator based on a result of the RF performance test, and forming a second passivation layer of each one of the first resonator and the second resonator on a corresponding one of the second electrodes.

16 Claims, 15 Drawing Sheets

FABRICATION METHOD OF FILM BULK ACOUSTIC RESONATOR (FBAR) FILTER DEVICE

CROSS-REFERENCE TO RELATED APPLICATIONS

The present application is based on and claims priority to Chinese Patent Application No. 202310969496.2, filed on Aug. 2, 2023, the entire contents of which are hereby incorporated by reference.

FIELD OF THE DISCLOSURE

The present disclosure relates to the field of electronic devices and, in particular, to a fabrication method of a film bulk acoustic resonator (FBAR) filter device.

BACKGROUND

A film bulk acoustic resonator (FBAR) filter device is a device including a thin film that is made of a piezoelectric material and disposed between two electrodes. Typically, a plurality of FBAR filter devices are fabricated on a wafer using semiconductor micro-processing technology. It is desirable to improve performance of the filter devices while maintaining consistency of the performance of the filter devices formed across the entire wafer.

SUMMARY

According to one aspect of the disclosure, a method for fabricating a film bulk acoustic resonator (FBAR) filter device is provided. The FBAR filter device includes at least a first resonator and a second resonator. The method includes: forming a first electrode of each one of the first resonator and the second resonator on a first surface of a piezoelectric layer, forming a first passivation layer of each one of the first resonator and the second resonator on a corresponding one of the first electrode of the first resonator and the first electrode of the second resonator, forming a second electrode of each one of the first resonator and the second resonator on a second surface of the piezoelectric layer, the second surface being opposite to the first surface, conducting a radio frequency (RF) performance test on the FBAR filter device, adjusting a thickness of the second electrode of the first resonator based on a result of the RF performance test, and forming a second passivation layer of each one of the first resonator and the second resonator on a corresponding one of the second electrode of the first resonator and the second electrode of the second resonator.

According to another aspect of the disclosure, a method for fabricating a film bulk acoustic resonator (FBAR) filter device is provided. The FBAR filter device includes at least a first resonator and a second resonator. The method includes: forming a first electrode of each one of the first resonator and the second resonator on a first surface of a piezoelectric layer, forming a first passivation layer of each one of the first resonator and the second resonator on a corresponding one of the first electrode of the first resonator and the first electrode of the second resonator, forming a second electrode of each one of the first resonator and the second resonator on a second surface of the piezoelectric layer, the second surface being opposite to the first surface, forming a second passivation layer of each one of the first resonator and the second resonator on a corresponding one of the second electrode of the first resonator and the second electrode of the second resonator, conducting a radio frequency (RF) performance test on the FBAR filter device, and adjusting a thickness of the second passivation layer of the first resonator based on a result of the RF performance test.

BRIEF DESCRIPTION OF DRAWINGS

The accompanying drawings, which are incorporated in and constitute a part of this application, illustrate disclosed embodiments and, together with the description, serve to explain the disclosed embodiments.

DETAILED DESCRIPTION

Figure 1:
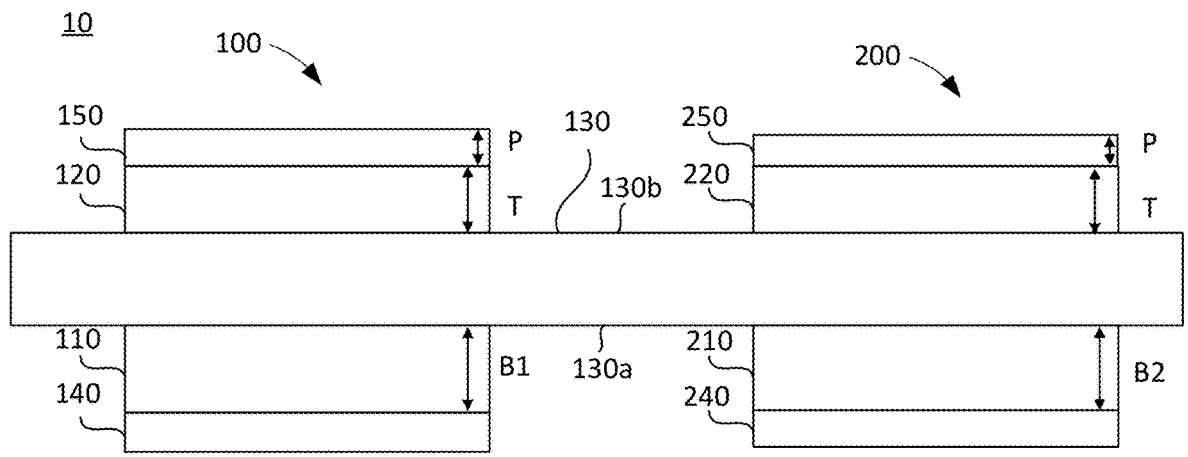
FIG. 1 is a sectional view of a FBAR filter device, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower,"

"above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

For FBAR bulk acoustic wave filters, in order to meet performance requirement of the filters, it may be needed to increase or decrease the electrode thickness on some resonators to form a difference in the thickness of the electrodes between different resonators. Typically, during the fabrication process, a target thickness is first determined, and then, the electrode thickness is increased or decreased to the target thickness by etching or lift-off. However, due to the complexity of the fabrication process of FBAR, the thickness of different regions of the wafer varies greatly, and the filter fabricated by the typical method may have poor consistency in electrical characteristics across the entire wafer, which negatively affects the wafer yield.

Embodiments of the present disclosure provide an improved fabrication process of a FBAR filter device, which changes the thickness of an electrode or passivation layer of a resonator of the FBAR filter device, so as to improve performance consistency of resonators formed across an entire wafer. Because the amount of thickness changed is generally small, it may not affect the performance of the resonator. The advantages of this method include that, before the thickness adjustment is performed on the electrode or passivation layer, the filter performance of different regions of the wafer can be obtained through RF performance tests, and results of the RF performance tests can be used for the adjustment of the thickness of the electrode or passivation layer. The thickness adjustment can be changed in different areas of the wafer according to the corresponding RF performance test results, so as to improve the consistency of the entire wafer, thereby enhancing the wafer yield.

FIG. 1 is a sectional view of a film bulk acoustic resonator (FBAR) filter device 10, according to an embodiment of the present disclosure. As illustrated in FIG. 1, FBAR filter device 10 includes a first resonator 100 and a second resonator 200.

First resonator 100 includes a first electrode 110 formed on a first surface 130a of a piezoelectric layer 130 and having a thickness B1, a second electrode 120 formed on a second surface 130b of piezoelectric layer 130 and having a thickness T, a first passivation layer 140 formed on first electrode 110, and a second passivation layer 150 formed on second electrode 120 and having a thickness P. Second surface 130b is parallel with, and opposite to, first surface 130a.

Second resonator 200 includes a first electrode 210 formed on first surface 130a of piezoelectric layer 130 and having a thickness B2, a second electrode 220 formed on second surface 130b of piezoelectric layer 130 and having the thickness T, a first passivation layer 240 formed on first electrode 210, and a second passivation layer 250 formed on second electrode 220 and having the thickness P.

Typically, in order to meet performance requirement for filter device 10, the electrodes of first resonator 100 and second resonator 200 are formed to have different thickness. For example, as illustrated in FIG. 1, thickness B1 of first electrode 110 of first resonator 100 is different from thickness B2 of first electrode 210 of second resonator 200, i.e., B1 B2. The thickness difference can be realized by reducing or increasing the electrode thickness B1 or B2 by etching or lift-off first electrode 110 or 210.

Figure 2:
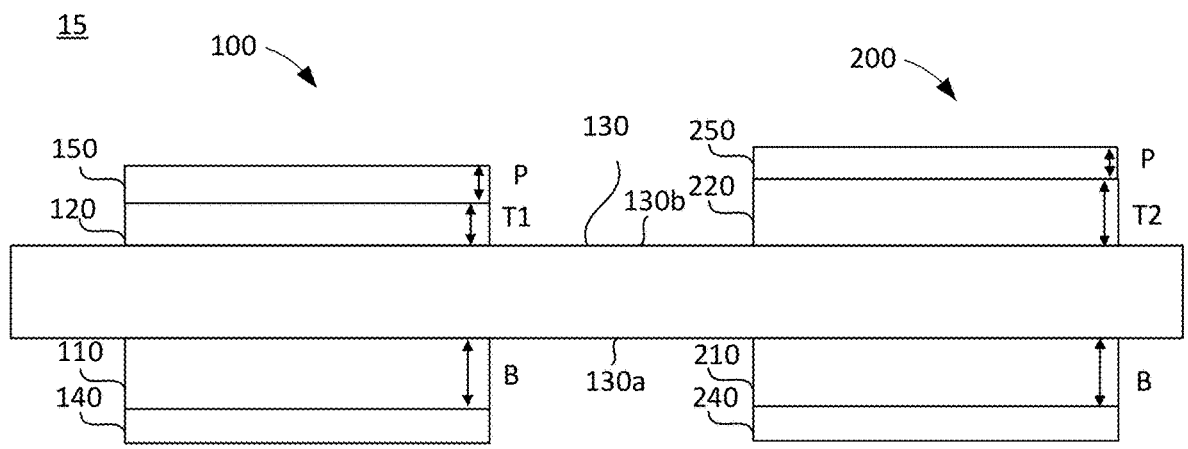
FIG. 2 is a sectional view of a FBAR filter device, according to another embodiment of the present disclosure.

FIG. 2 is a sectional view of a FBAR filter device 15, according to an embodiment of the present disclosure. The structure and components of FBAR filter device 15 of FIG. 2 are similar to those of FBAR filter device 10 of FIG. 1, except that, in FBAR filter device 15 of FIG. 2, both of first electrode 110 of first resonator 100 and first electrode 210 of second resonator 200 are formed with a thickness B, while second electrode 120 of first resonator 100 is formed with a thickness T1, and second electrode 220 of second resonator 200 is formed with a thickness T2 which is different from thickness T1, in order to meet performance requirement for filter device 15.

Figure 3:
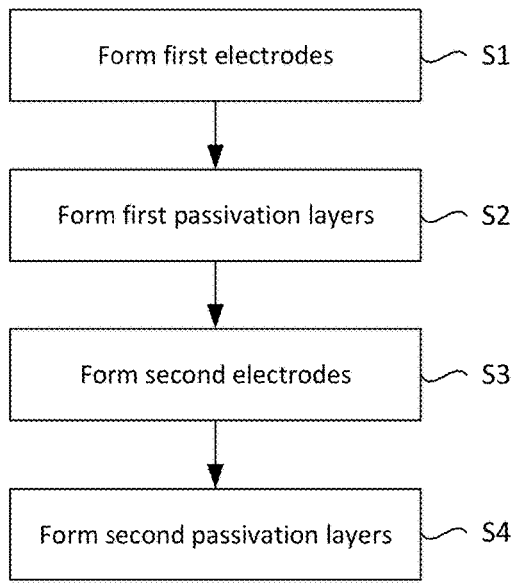
FIG. 3 is a flow chart of a process of fabricating a FBAR filter device, according to an embodiment of the present disclosure.

FIG. 3 is a flow chart of a process 300 of fabricating a FBAR filter device, according to an embodiment of the present disclosure. For example, the FBAR filter device may be the FBAR filter device 15 in FIG. 2. FIGS. 4A-4F are sectional views of structures formed in process 300, according to an embodiment of the present disclosure.

Figure 4A:
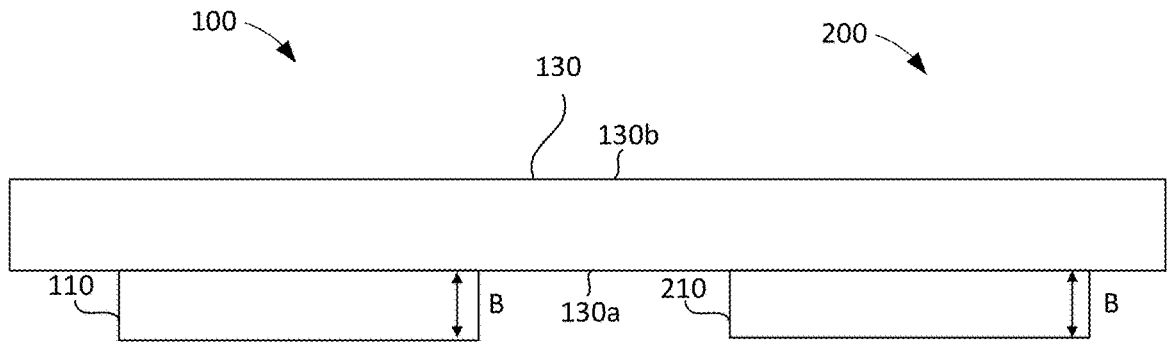
FIGS. 4A-4F are sectional views of structures formed in the process of FIG. 3, according to an embodiment of the present disclosure.

As illustrated in FIGS. 3 and 4A, in step S1, first electrode 110 of first resonator 100 and first electrode 210 of second resonator 200 are formed on first surface 130a of piezoelectric layer 130. Both of first electrode 110 of first resonator 100 and first electrode 210 of second resonator 200 are formed with a thickness B. First electrodes 110 and 210 may be formed of any suitable conductor material, such as various metal materials with conductive properties or a stack combination of several conductive metal materials, such as molybdenum (Mo), aluminum (Al), copper (Cu), platinum (Pt), tantalum (Ta), tungsten (W), palladium (Pd), ruthenium (Ru), etc. In the present example, first electrodes 110 and 210 are formed of molybdenum (Mo).

Figure 4B:
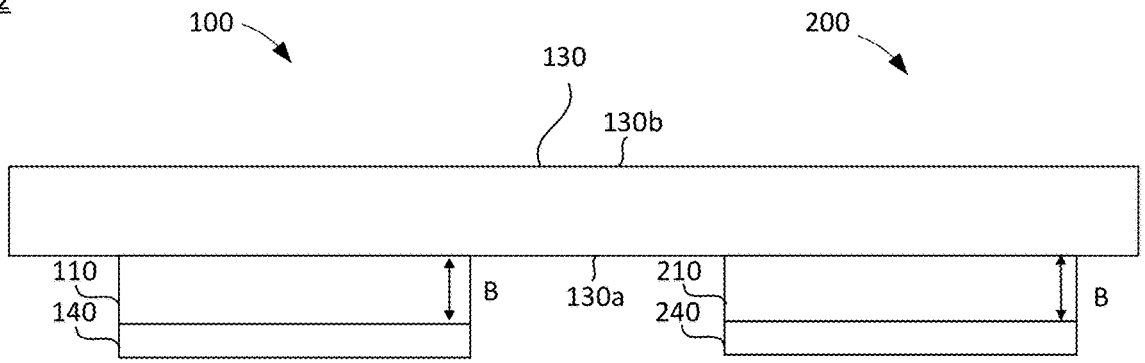

As illustrated in FIGS. 3 and 4B, in step S2, first passivation layer 140 of first resonator 100 is deposited on first electrode 110 of first resonator 100, and first passivation layer 240 of second resonator 200 is deposited on first electrode 210 of second resonator 200. First passivation layers 140 and 240 may be formed of non-conductive materials such as silicon nitride (SiN) or aluminum nitride (AlN). First passivation layers 140 and 240 may have the same thickness.

Figure 4C:
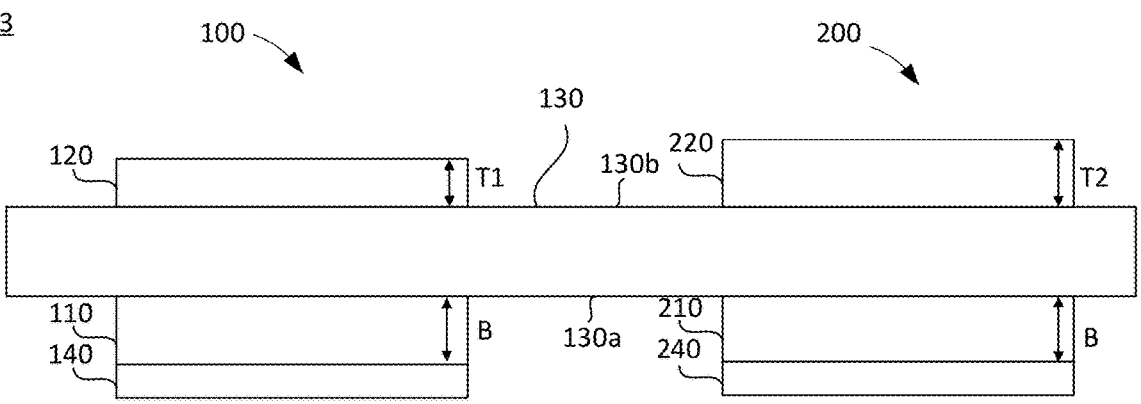

As illustrated in FIGS. 3 and 4C, in step S3, second electrode 120 of first resonator 100 and second electrode 220 of second resonator 200 are formed on second surface 130b of piezoelectric layer 130. The thicknesses of second electrode 120 and second electrode 220 may be T1 and T2, respectively. Thickness T2 may be greater or smaller than thickness T1.

Figure 4D:
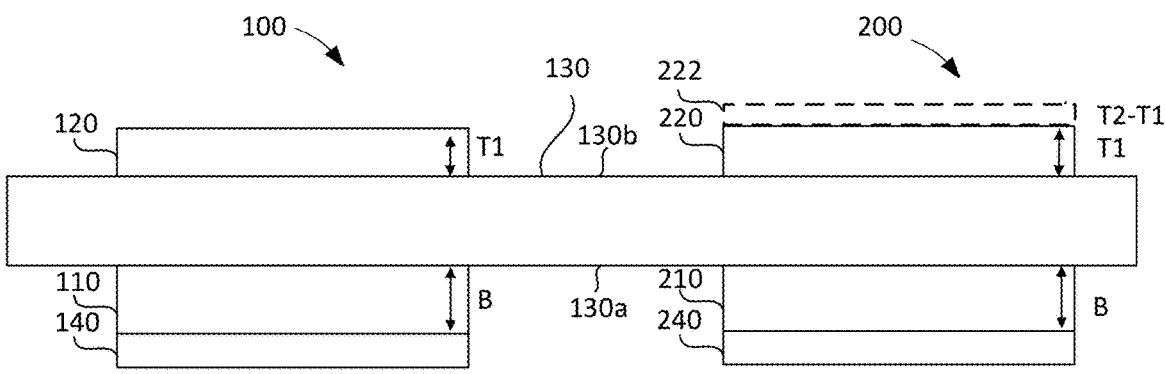

Second electrode 120 and second electrode 220 with different thicknesses may be formed using various methods. For example, as illustrated in FIG. 4D, in step S31, second electrode 120 and second electrode 220 with the same thickness T1 may be grown at the same time. Then, an electrode layer 222 with a thickness of (T2-T1) may be grown on second electrode 220 of second resonator 200 by means of lift-off, thereby forming second electrode 120 with the thickness T1 and second electrode 220 with the thickness T2.

Figure 4E:
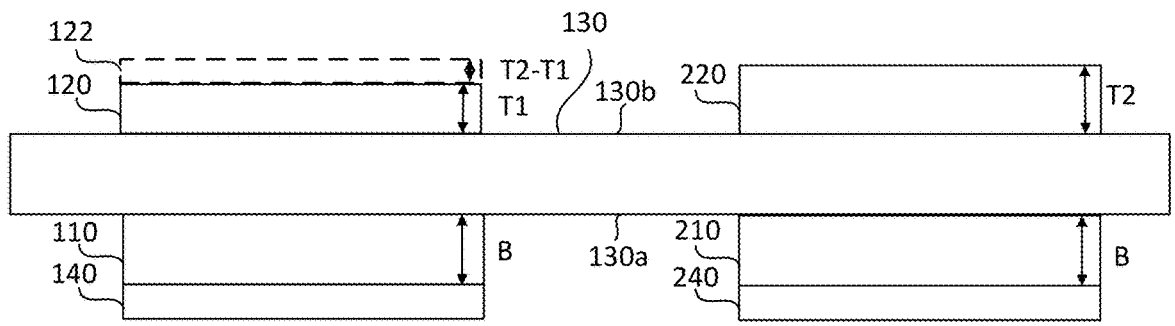

For another example, as illustrated in FIG. 4E, in step S32, second electrode 120 and second electrode 220 with the same thickness of T2 may be grown at the same time. Then, second electrode 120 of first resonator 100 may be etched to remove a top layer 122 with a thickness of (T2-T1), thereby forming first electrode 120 with the thickness T1 and second electrode 220 with the thickness T2.

Figure 4F:
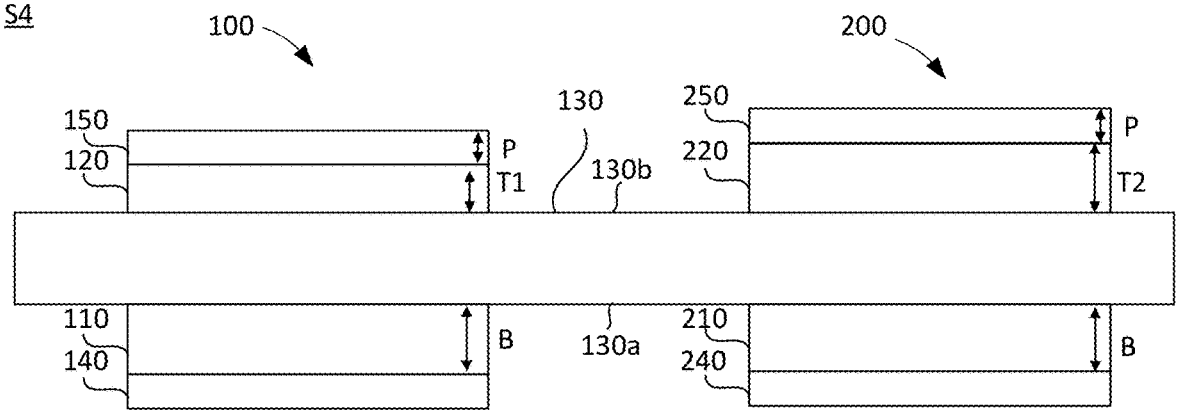

As illustrated in FIGS. 3 and 4F, in step S4, second passivation layer 150 of first resonator 100 is grown on second electrode 120 of first resonator 100, and second passivation layer 250 of second resonator 200 is grown on second electrode 220 of second resonator 200. Second passivation layers 150 and 250 may be formed of the same thickness P.

Figure 5:
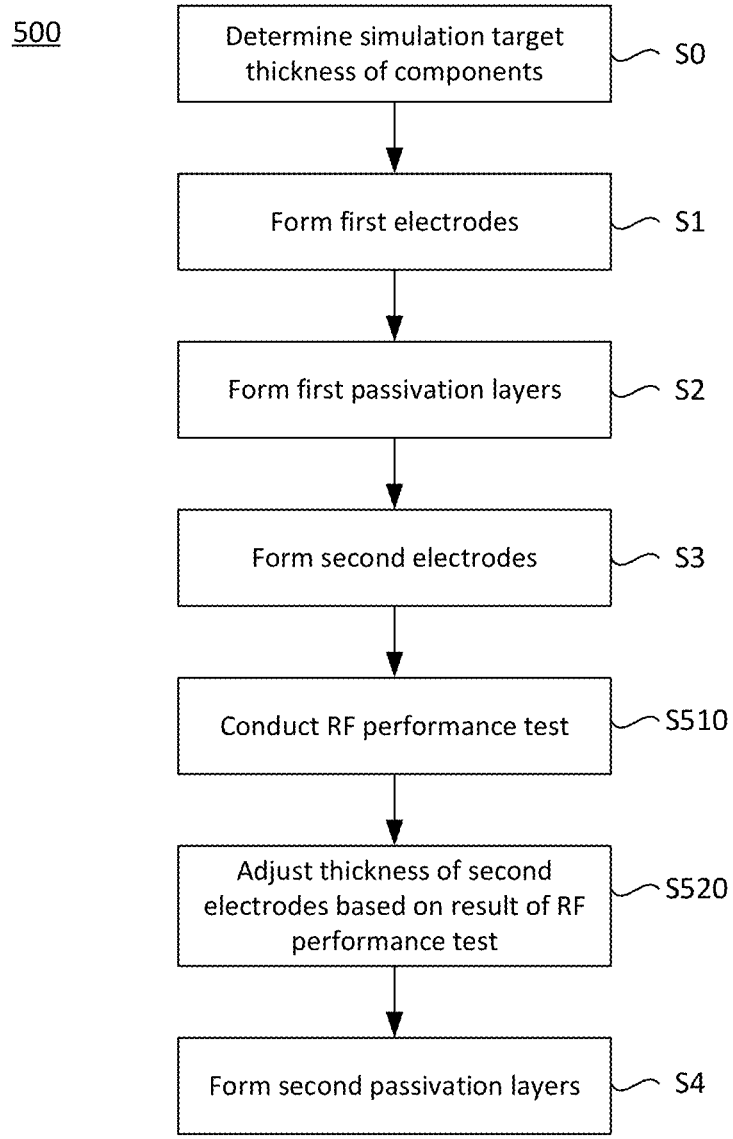
FIG. 5 is a flow chart of a process of fabricating a FBAR filter device, according to an embodiment of the present disclosure.

FIG. 5 is a flow chart of a process 500 of fabricating a FBAR filter device, according to an embodiment of the present disclosure. For example, the FBAR filter device may be the FBAR filter device 15 in FIG. 2. FIGS. 6A-6E are sectional views of structures formed in process 500, according to an embodiment of the present disclosure.

As illustrated in FIG. 5, process 500 begins with step S0, in which a simulation of FBAR filter device 15 is performed according to a target performance parameter of FBAR filter device 15, to determine simulation target thicknesses of each one of the various components of first resonator 100 and second resonator 200, including first electrodes 110 and 210, second electrodes 120 and 220, first passivation layers 140 and 240, and second passivation layer 150 and 250.

Figure 6A:
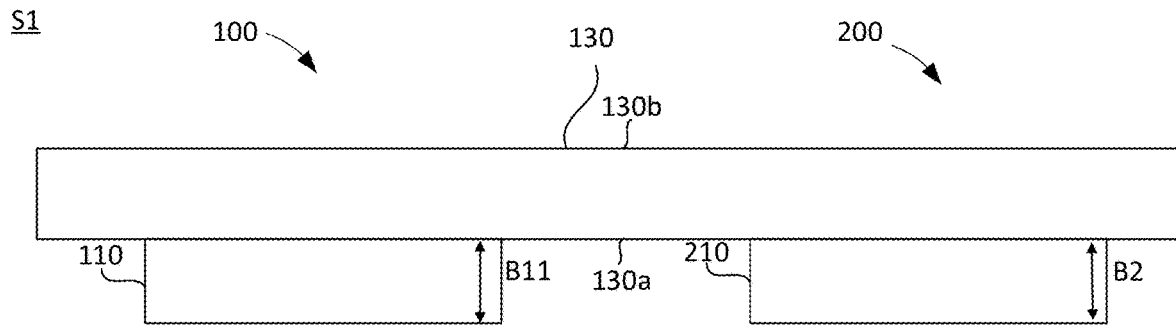
FIGS. 6A-6E are sectional views of structures formed in the process of FIG. 5, according to an embodiment of the present disclosure.

As illustrated in FIGS. 5 and 6A, in step S1, first electrode 110 of first resonator 100 and first electrode 210 of second resonator 200 are formed on first surface 130a of piezoelectric layer 130. First electrode 110 of first resonator 100 is formed with a thickness B111. First electrode 210 of second resonator 200 is formed with a thickness B2 different from thickness B111. The thickness B2 is the simulation target thickness of first electrode 210, obtained from step S0. Thickness B111 of first electrode 110 of first resonator 100 may be, e.g., greater than the simulation target thickness B1 of first electrode 210, obtained from step S0, by approximately several angstroms (Å) to tens of nanometers (nm), in order to leave room for the subsequent adjustment of the thickness of second electrode 120 of first resonator 100. If the difference between thickness B111 of first electrode 110 and the simulation target thickness B1 is too large, the overall performance of filter device 15 may be negatively affected. First electrode 110 and first electrode 210 with different thicknesses may be formed using a method similar to the method for forming second electrode 120 and second electrode 220 with different thicknesses, described above with reference to FIGS. 4D and 4F. Therefore, detailed descriptions of forming first electrode 110 and first electrode 210 with different thicknesses will not be repeated.

Figure 6B:
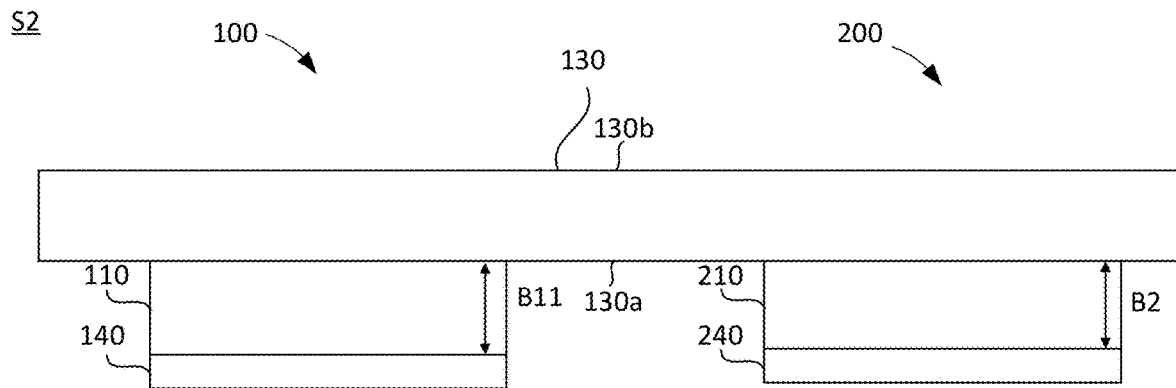

As illustrated in FIGS. 5 and 6B, in step S2, first passivation layer 140 of first resonator 100 is deposited on first electrode 110 of first resonator 100, and first passivation layer 240 of second resonator 200 is deposited on first electrode 210 of second resonator 200. First passivation layers 140 and 240 may be formed of non-conductive materials such as silicon nitride (SiN) or aluminum nitride (AlN). First passivation layers 140 and 240 may have the same thickness.

Figure 6C:
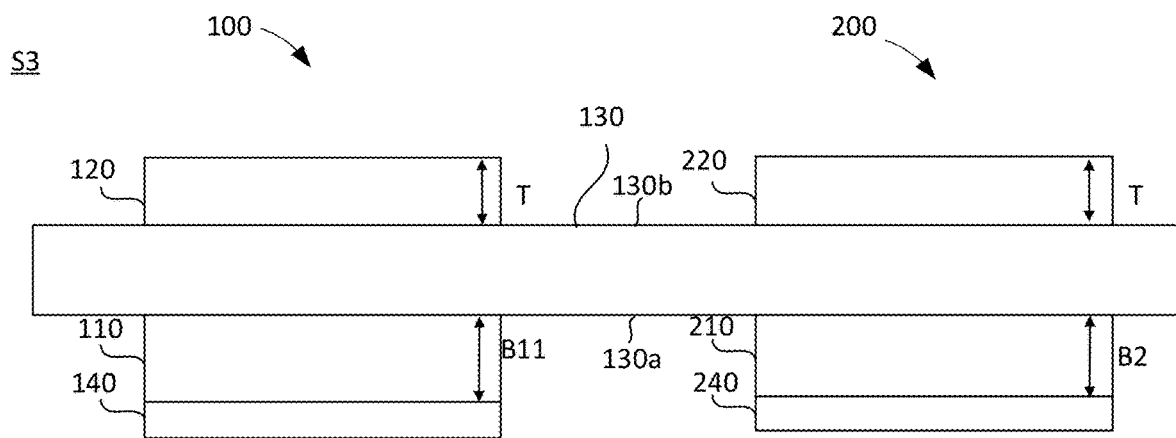

As illustrated in FIGS. 5 and 6C, in step S3, second electrode 120 of first resonator 100 and second electrode 220 of second resonator 200 are formed on second surface 130b of piezoelectric layer 130. Second electrodes 120 and 220 may be formed of a same thickness T. The thickness T may be the simulation target thickness of second electrode 220 of second resonator 200, obtained from step S0. Second electrodes 120 and 220 may be formed before step S1, i.e., before forming first electrodes 110 and 210. The present disclosure does not limit the order of forming first electrodes 110 and 210, and second electrodes 120 and 220.

As illustrated in FIG. 5, in step S510, a radio frequency (RF) performance test is conducted on the FBAR filter device to obtain a measured value of an RF parameter of the FBAR filter device. In one embodiment, the RF performance test may be a frequency response test, and the RF parameter may be a frequency bandwidth in a frequency response curve obtained through the frequency response test.

Figure 7:
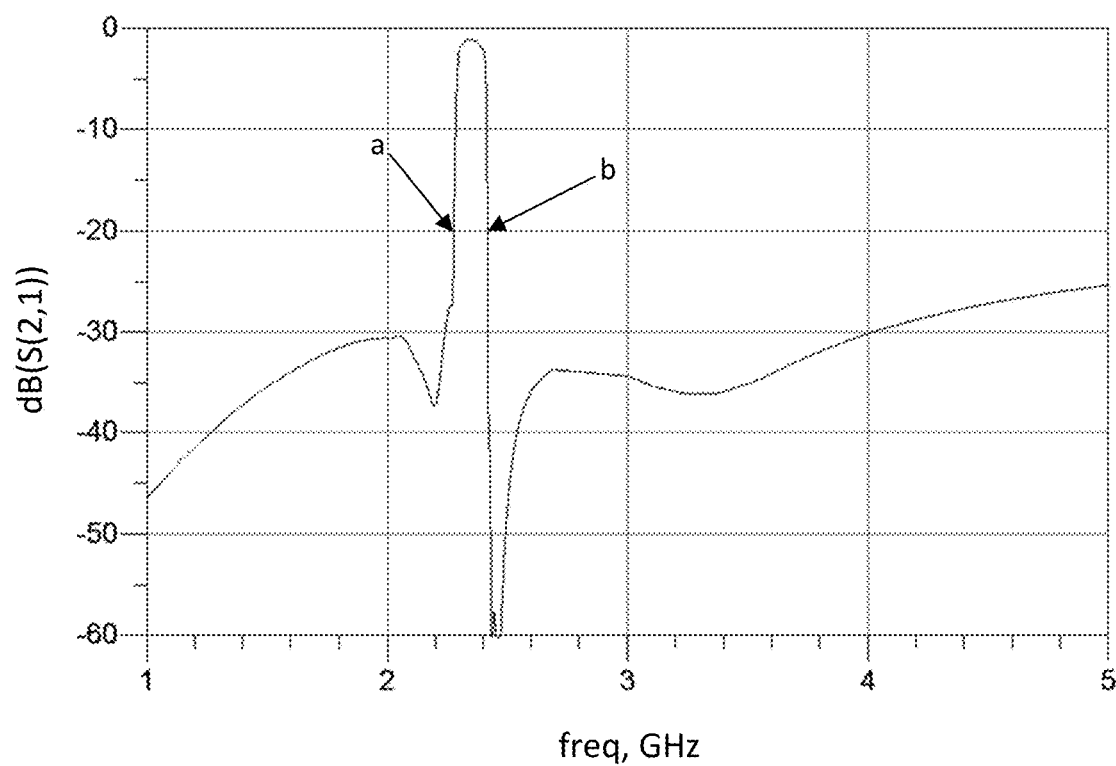
FIG. 7 illustrates a diagram of an exemplary frequency response curve obtained through a frequency response test conducted on a FBAR filter device, according to an embodiment of the present disclosure.

FIG. 7 illustrates a diagram of an exemplary frequency response curve obtained through a frequency response test conducted on a FBAR filter device, according to an embodiment of the present disclosure. In the diagram, the abscissa is a frequency sweep input into the FBAR filter device, and the ordinate is the response of the FBAR filter device at different frequencies. The higher the value at the ordinate, the stronger the response at the corresponding frequency.

Based on the frequency response curve, a frequency bandwidth at a certain response level (e.g., −20 db) can be obtained. As shown in FIG. 7, the frequency bandwidth at the response level of −20 db may be represented by (b−a), where a represents the left-side (i.e., lower) frequency value corresponding to the response level of −20 db, and b represents the right-side (i.e., higher) frequency value corresponding to the response level of −20 db. Here, −20 db is used as an example for the response level in obtaining the frequency bandwidth. In other example, −10 db, or −30 db, or other values where the slope of the frequency response curve is steep, can be used for the response level in obtaining the frequency bandwidth.

Figure 6D:
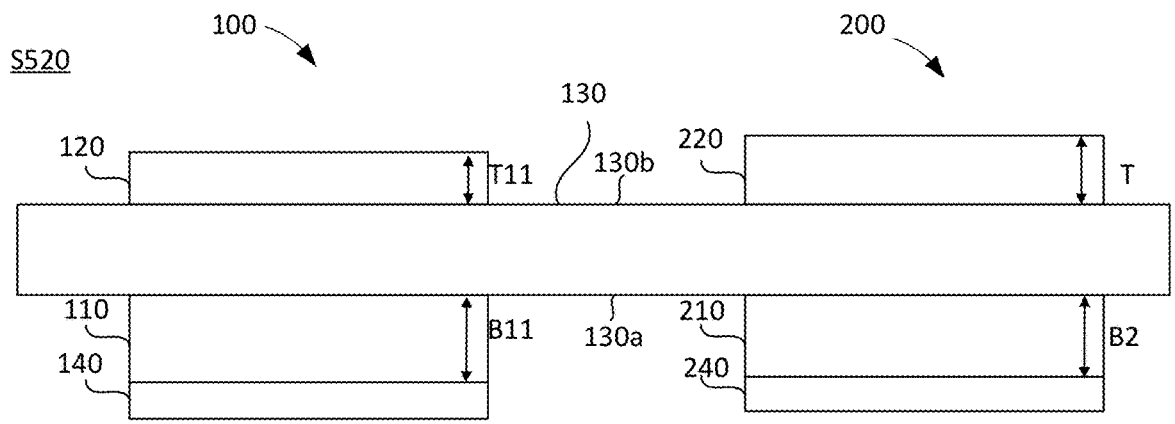

As illustrated in FIGS. 5 and 6D, in step S520, according to the results obtained through the RF performance test conducted in step S510, a thickness difference $\Delta T$ between the actual thickness T and a desired thickness T11 of second electrode 120 of first resonator 100, namely, $\Delta T=T-T11$, is calculated. Then, the thickness of second electrode 120 is adjusted by ion beam trimming (IBT), so that the thickness changes from T to T11 (e.g., T11<T).

In the embodiment, the thickness difference $\Delta T$ has a direct proportional relationship with a difference $\Delta(b-a)$ between the measured value of the frequency bandwidth (b−a) and a target value of the frequency bandwidth $(b-a)_{target}$, namely, $\Delta(b-a)=(b-a)_{target}-(b-a)$. That is, $\Delta(b-a)=k1*\Delta T$, where k1 is a coefficient which is usually a constant for a certain product. The coefficient k1 can be determined through actual production or experiment in a process of data acquisition. The coefficient k1 may be different for different products.

Therefore, when the coefficient k1 and the simulation target value of the frequency bandwidth $(b-a)_{target}$ are known, the desired thickness T11 of second electrode 120 of first resonator 100 can be obtained by first measuring the frequency bandwidth (b−a) through the RF performance test, and then calculating the thickness difference $\Delta T$ between the actual thickness T and the desired thickness T11 of second electrode 120 of first resonator 100 based on the measured frequency bandwidth (b−a).

In some embodiments, a plurality of filter devices having similar structures may be simultaneously formed on a wafer. Because the measured values of the RF parameter (e.g., frequency bandwidth (b−a)) for different filter devices formed in different areas of the wafer may be different, the thickness differences ΔT of the different filter devices formed in different areas may also be different. According to the different thickness differences ΔT, the thickness of second electrodes 120 in different areas of the wafer may be adjusted to obtain different T11. As a result, uniformity and consistency of the performance of the filter devices formed on the entire wafer may be improved, and the yield of the wafer may be enhanced.

Figure 8:
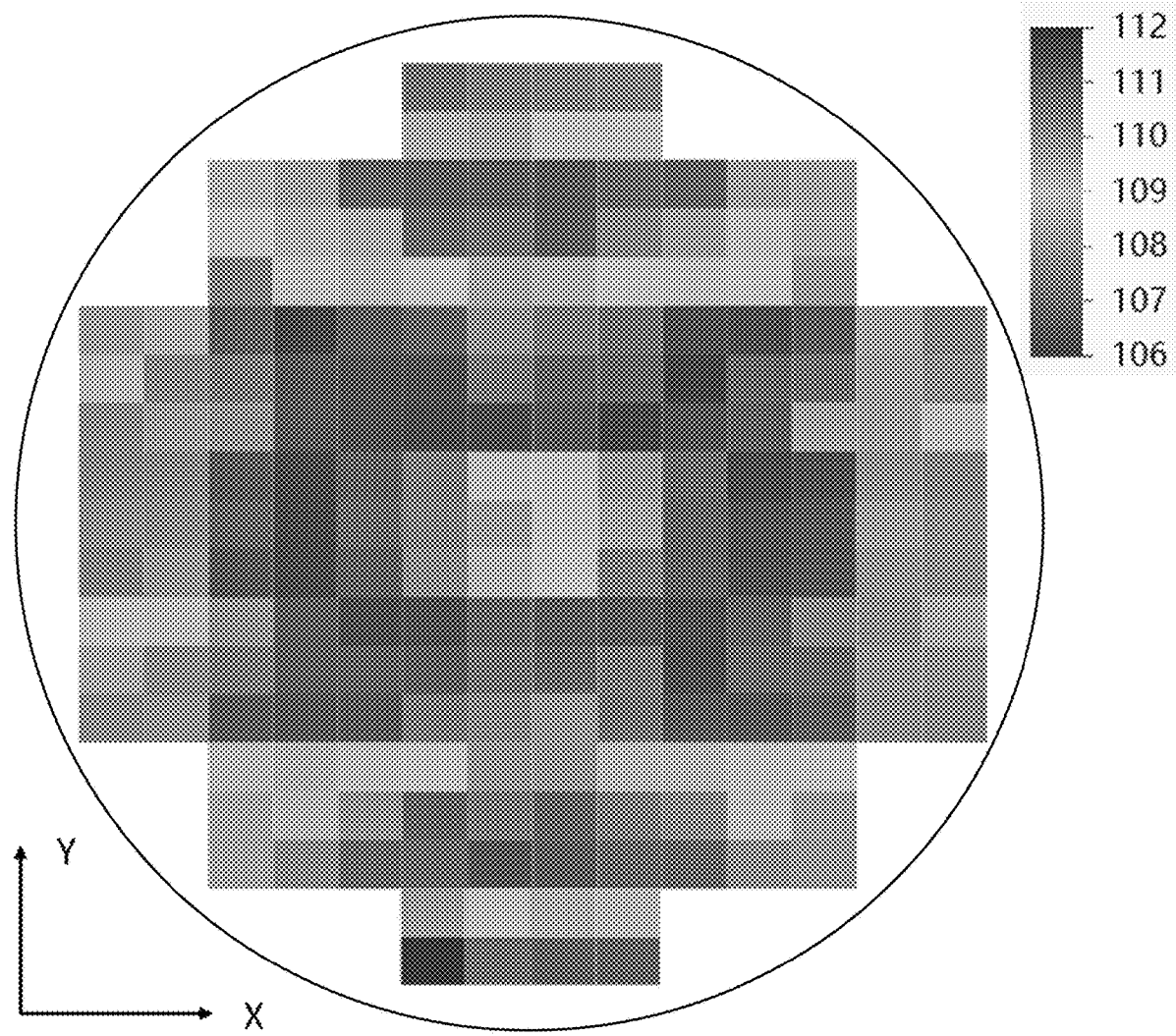
FIG. 8 illustrates an example of a heat map of a wafer, obtained according to an embodiment of the present disclosure.

For example, the measured values of the RF parameter of the filter devices formed on the entire wafer can be drawn to form a heat map. FIG. 8 illustrates an example of a heat map of a wafer, obtained according to an embodiment of the present disclosure. As shown in FIG. 8, the outermost circle can be considered as a wafer boundary. In the heat map, the measured values of the frequency bandwidth (b–a) obtained through the RF performance test are drawn according to the coordinates of different dies at different positions where the RF performance test is conducted. As shown in FIG. 8, different grey scales represents different values of the frequency bandwidth (b–a).

For example, if the target value of the frequency bandwidth $(b-a)_{target}$ is 120 MHz, the difference $\Delta(b-a)$ between the measure value (b–a) and the target value of the frequency bandwidth $(b-a)_{target}$ may be calculated according to the target value of 120 MHz, namely $\Delta(b-a)=(b-a)_{target}-(b-a)$. Then, the thickness difference ΔT between the desired thickness and actual thickness of second electrode 120 of first resonator 100 may be calculated according to $\Delta(b-a)=k1*\Delta T$. The calculated ΔT may be input into a machine for trimming the second electrode 120 of first resonator 100 to obtain the desired thickness at different areas on the wafer.

The trimming may be performed by using the IBT method to bombard the surface of the wafer with a focused ion beam, while controlling the residence time of the ion beam focal spot in a local area to achieve ΔT changes in different areas to achieve quantitative removal of the material of second electrode 120 in different area, so that the performance of the plurality of filter devices formed on the entire wafer may be closer to the target value, thereby improving the uniformity and consistency of the entire wafer and improving the yield rate of the wafer.

Figure 6E:
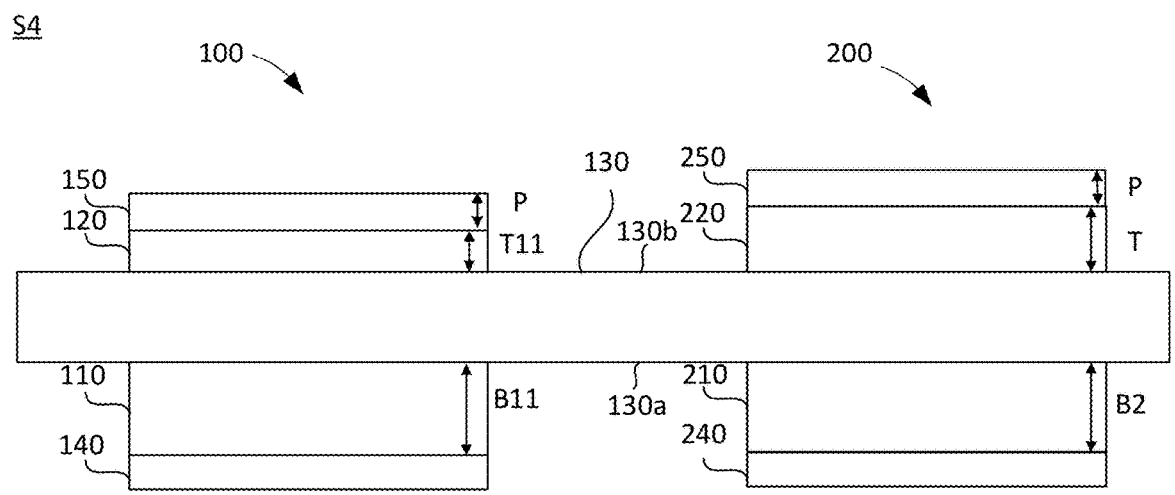

As illustrated in FIGS. 5 and 6E, in step S4, second passivation layer 150 of first resonator 100 is formed on second electrode 120 of first resonator 100, and second passivation layer 250 of second resonator 200 is formed on second electrode 220 of second resonator 200. Second passivation layers 150 and 250 may be formed of a same thickness P. The thickness P may be the simulation target thickness of second passivation layer 250, obtained from step S0. Second passivation layers 150 and 250 may be formed of non-conductive materials such as silicon nitride (SiN), or aluminum nitride (AlN).

Compared with process 300 described with reference to FIGS. 3 and 4A-4F, by using process 500, the electrodes on different sides of the piezoelectric layer (e.g., first electrodes 110 and 210, and second electrodes 120 and 220) are formed to have different thicknesses for different resonators. Thus, the desired thickness T11 of second electrode 120 of first resonator 100 may be determined and adjusted based on the results of the RF performance test. As a result, the performance and consistency of first and second resonators 100 and 200 and the filter devices formed across the entire wafer, and wafer yield rate may be enhanced.

In the embodiment illustrated in FIGS. 6A-6E, as an example, FBAR filter device 15 includes one first resonator 100 and one second resonator 200. In other embodiments, the filter device may include one or more first resonators 100 and one or more second resonators 200.

Figure 9:
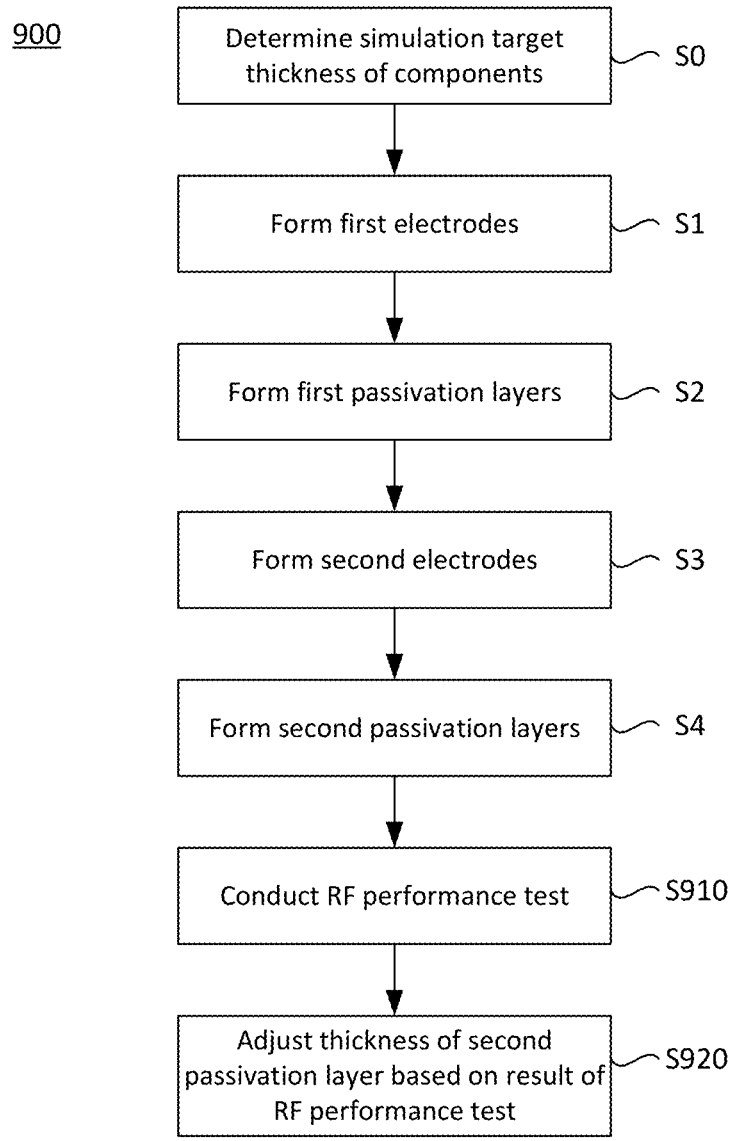
FIG. 9 is a flow chart of a process of fabricating a FBAR filter device of FIG. 2, according to an embodiment of the present disclosure.

FIG. 9 is a flow chart of a process 900 of fabricating a FBAR filter device, according to an embodiment of the present disclosure. For example, the FBAR filter device may be the FBAR filter device 15 in FIG. 2. FIGS. 10A-10E are sectional views of structures formed in process 900, according to an embodiment of the present disclosure.

Process 900 illustrated FIG. 9 is similar to process 500 illustrated in FIG. 5. In process 900, the RF performance test (step S910) is conducted after second passivation layers 150 and 250 are formed in step S4, and the thickness of second passivation layer 150 is adjusted based on the result of the RF performance test in step S920. Steps S0, S1, S2, and S3 of process 900 are similar to steps S0, S1, S2, and S3 of process 500. Therefore, detailed descriptions of those steps, as well as the structures formed in those steps and illustrated in FIGS. 10A-10C, may not be repeated.

As illustrated in FIG. 9, process 900 begins with step S0, in which a simulation of FBAR filter device 15 is performed according to a target performance parameter of FBAR filter device 15, to determine simulation target thicknesses of each one of the various components of first resonator 100 and second resonator 200, including first electrodes 110 and 210, second electrodes 120 and 220, first passivation layers 140 and 240, and second passivation layer 150 and 250.

Figure 10A:
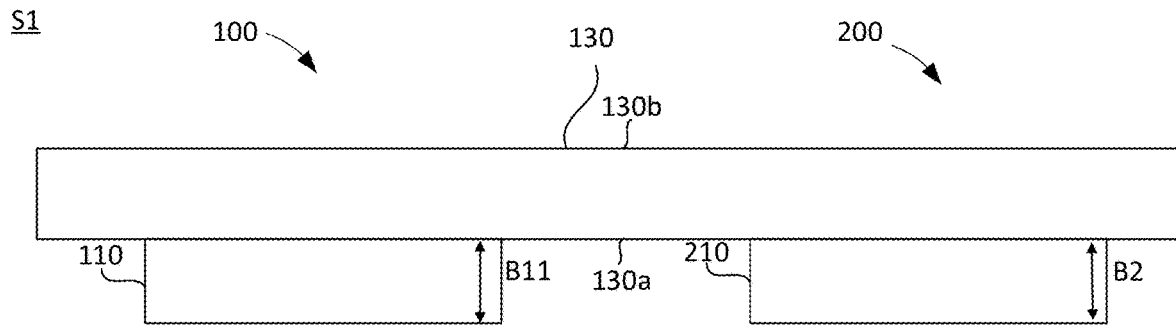
FIGS. 10A-10E are sectional views of structures formed in the process of FIG. 9, according to an embodiment of the present disclosure.

As illustrated in FIGS. 9 and 10A, in step S1, first electrode 110 of first resonator 100 and first electrode 210 of second resonator 200 are formed on first surface 130a of piezoelectric layer 130. First electrode 110 of first resonator 100 is formed with thickness B111. First electrode 210 of second resonator 200 is formed with a thickness B2 different from thickness B111.

Figure 10B:
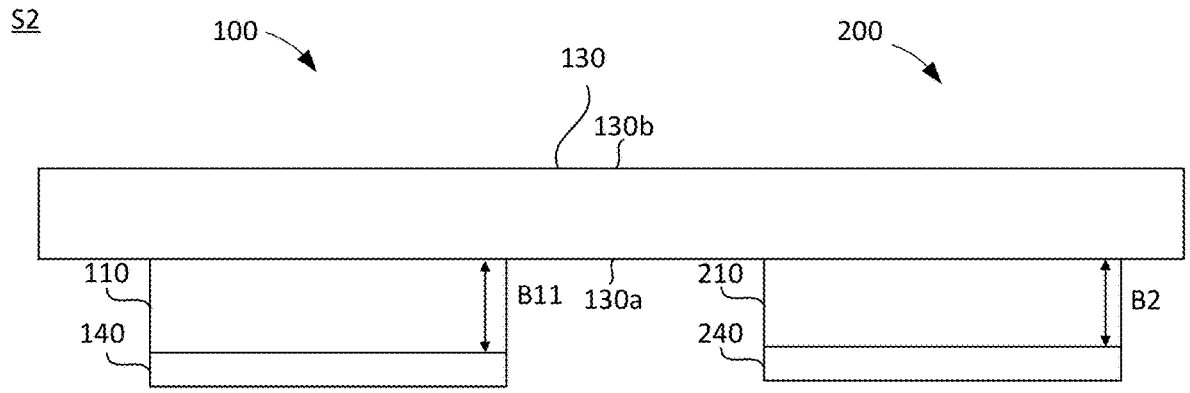

As illustrated in FIGS. 9 and 10B, in step S2, first passivation layer 140 of first resonator 100 is deposited on first electrode 110 of first resonator 100, and first passivation layer 240 of second resonator 200 is deposited on first electrode 210 of second resonator 200.

Figure 10C:
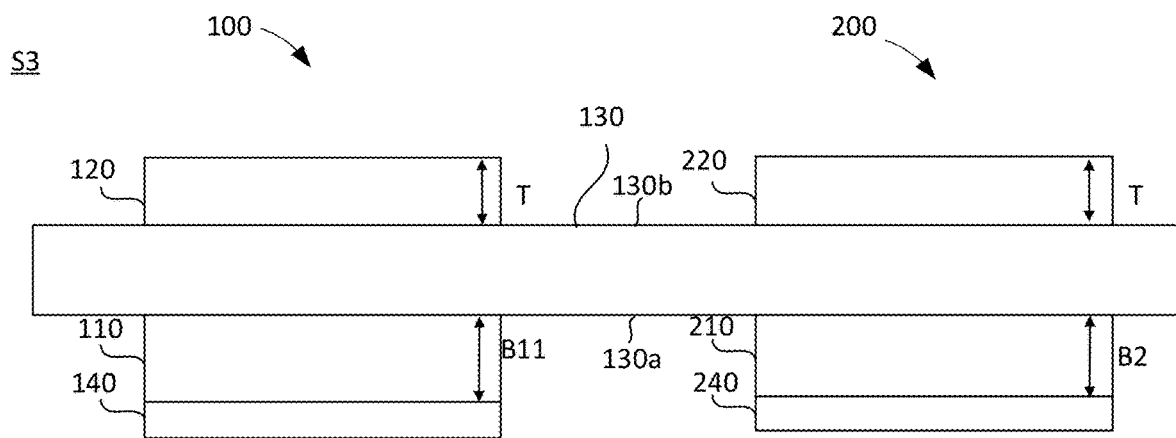

As illustrated in FIGS. 9 and 10C, in step S3, second electrode 120 of first resonator 100 and second electrode 220 of second resonator 200 are formed on second surface 130b of piezoelectric layer 130. Second electrodes 120 and 220 may be formed of the same thickness T.

Figure 10D:
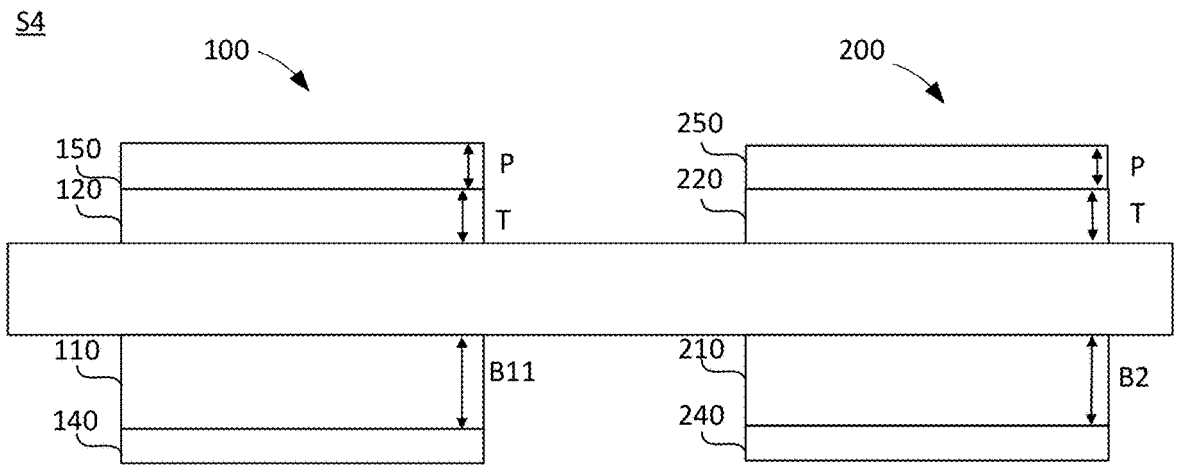

As illustrated in FIGS. 9 and 10D, in step S4, second passivation layer 150 with thickness P is formed on second electrode 120 with thickness T, and second passivation layer 250 with thickness P is formed on second electrode 220 with thickness T.

As illustrated in FIG. 9, in step S910, a radio frequency (RF) performance test is conducted on the FBAR filter device to obtain a measured value of an RF parameter of the FBAR filter device. Similar to process 500 (FIG. 5), the RF performance test performed in process 900 may be a frequency response test, and the RF parameter may be a frequency bandwidth (b–a) in a frequency response curve obtained through the frequency response test.

Figure 10E:
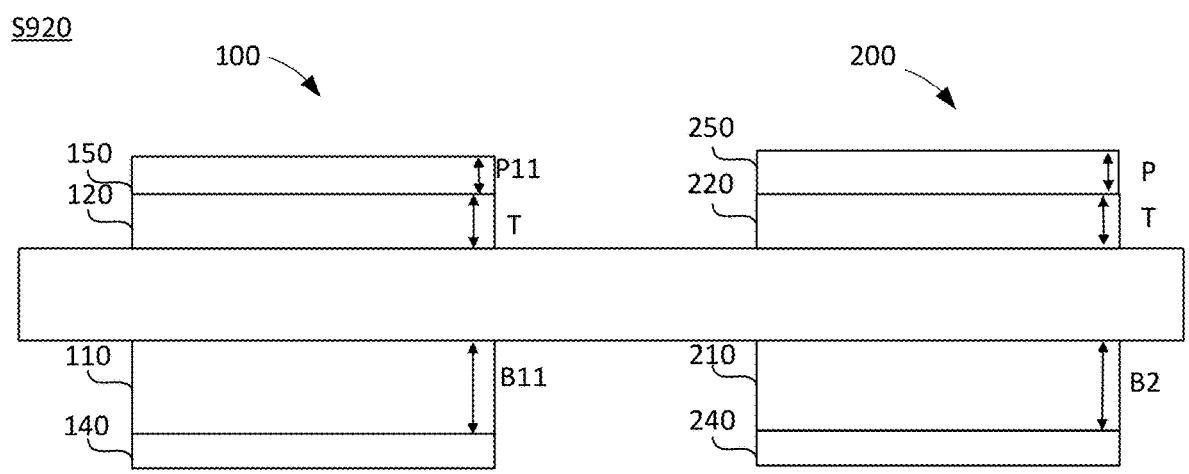

As illustrated in FIGS. 9 and 10E, in step 920, according to the results obtained through the RF performance test conducted in step 910, a thickness difference ΔP between the actual thickness P and a desired thickness P11 of second passivation layer 150 of first resonator, namely, ΔP=P−P11, is calculated. Then, the thickness of second passivation layer 150 is adjusted by means of IBT, so that the thickness changes from P to P11 (e.g., P11<P).

In the embodiment, the thickness difference ΔP of second passivation layer 150 has a direct proportional relationship with the difference Δ(b–a) between the measured value of the frequency bandwidth (b−a) and a target value of the frequency bandwidth $(b-a)_{target}$, namely, $\Delta(b-a)=(b-a)_{target}-(b-a)$. That is, $\Delta(b-a)=k2*\Delta P$, where k2 is a coefficient which is usually a constant for a certain product. The coefficient k2 can be determined through actual production or experiment in a process of data acquisition. The coefficient k2 is different for different products. In addition, the coefficient of variation of the thickness of the electrode layer with respect to the frequency bandwidth may be different from that of the passivation layer. In other words, k2≠k1.

Therefore, when the coefficient k2 and the simulation target value of the frequency bandwidth $(b-a)_{target}$ are known, the desired thickness P11 of second passivation layer 150 of first resonator 100 can be obtained by first measuring the frequency bandwidth (b−a) through the RF performance test, and then calculating the thickness difference ΔP between the actual thickness P and the desired thickness P11 of second passivation layer 150 based on the measured frequency bandwidth (b−a).

Compared with process 300 described with reference to FIGS. 3 and 4A-4F, by using process 900, the electrodes on one side of the filter device (e.g., first electrodes 110 and 210) and the passivation layer on the other side of the filter device (e.g., second passivation layers 150 and 250), are formed to have different thicknesses for different resonators. Thus, the desired thickness P11 of second passivation layer 150 of first resonator 100 may be determined and adjusted based on the results of the RF performance test. As a result, the performance and consistency of first and second resonators 100 and 200 and the filter devices formed across the entire wafer, and wafer yield rate may be enhanced.

In the embodiment illustrated in FIGS. 10A-10E, as an example, FBAR filter device 15 includes one first resonator 100 and one second resonator 200. In other embodiments, the filter device may include one or more first resonators 100 and one or more second resonators 200.

Figure 11:
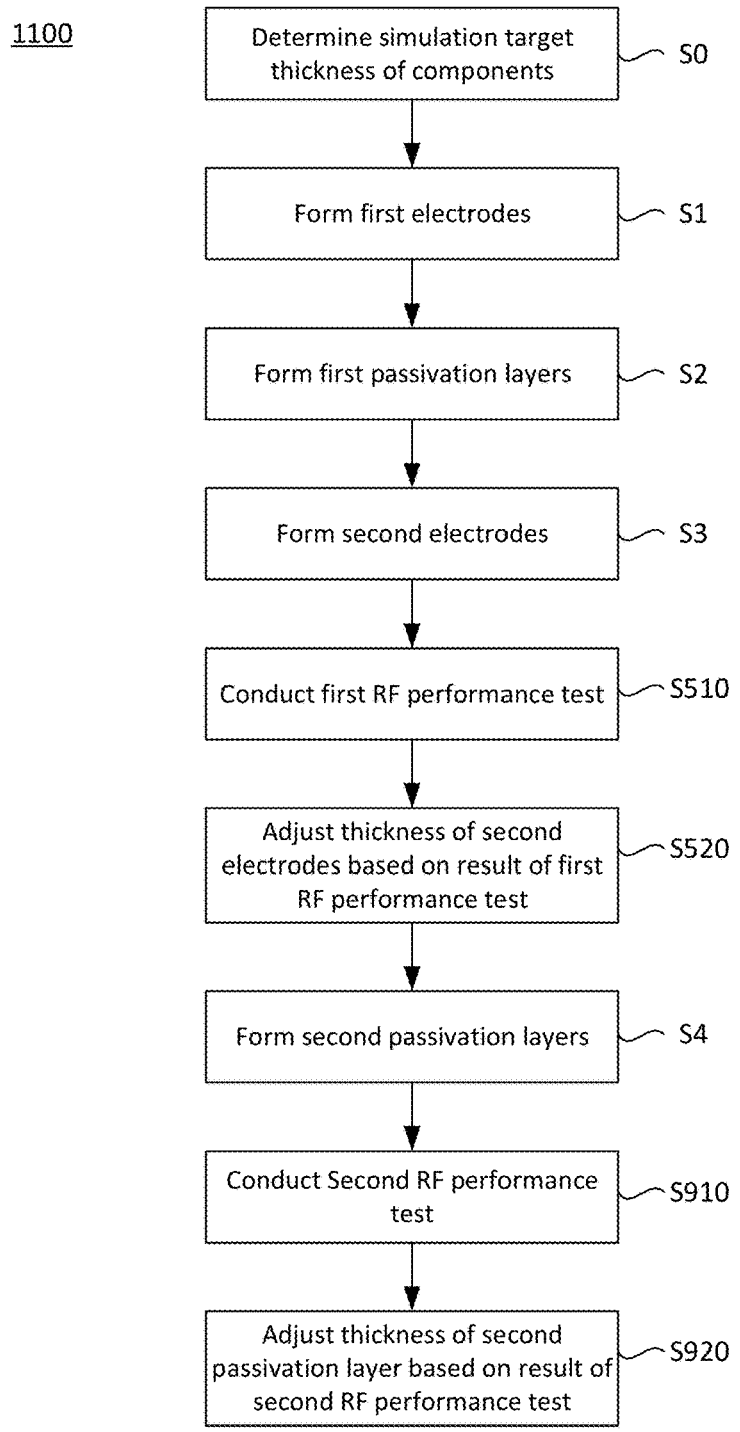
FIG. 11 is a flow chart of a process of fabricating a FBAR filter device, according to an embodiment of the present disclosure.

FIG. 11 is a flow chart of a process 1100 of fabricating a FBAR filter device, according to an embodiment of the present disclosure. For example, the FBAR filter device may be the FBAR filter device 15 in FIG. 2. FIGS. 12A-12F are sectional views of structures formed in process 1100, according to an embodiment of the present disclosure.

Process 1100 illustrated FIG. 11 is similar to process 500 illustrated in FIG. 5, except that, in process 1100, a second RF performance test (step S910) is conducted after second passivation layers 150 and 500 are formed, and the thickness of second passivation layer 150 is adjusted based on the result of the second RF performance test in step S920. Steps S0, S1, S2, S3, S510, S520, and S4 of process 1100 are similar to those steps of process 500. Therefore, detailed descriptions of those steps, as well as the structures formed in those steps and illustrated in FIGS. 12A-12E, may not be repeated. In addition, steps S910 and S920 of process 1100 are similar to steps 910 and S920 of process 900, Therefore, detailed descriptions of those steps, may also not be repeated.

As illustrated in FIG. 11, process 1100 begins with step S0, in which a simulation of FBAR filter device 15 is performed according to a target performance parameter of FBAR filter device 15, to determine simulation target thicknesses of each one of the various components of first resonator 100 and second resonator 200, including first electrodes 110 and 210, second electrodes 120 and 220, first passivation layers 140 and 240, and second passivation layer 150 and 250.

Figure 12A:
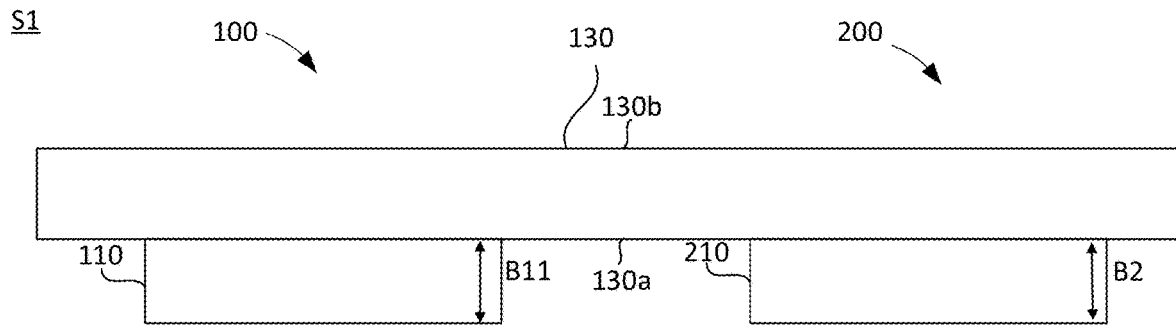
FIGS. 12A-12F are sectional views of structures formed in the process of FIG. 11, according to an embodiment of the present disclosure.

As illustrated in FIGS. 11 and 12A, in step S1, first electrode 110 of first resonator 100 and first electrode 210 of second resonator 200 are formed on first surface 130a of piezoelectric layer 130. First electrode 110 of first resonator 100 is formed with a thickness B11. First electrode 210 of second resonator 200 is formed with a thickness B2 different from thickness B11.

Figure 12B:
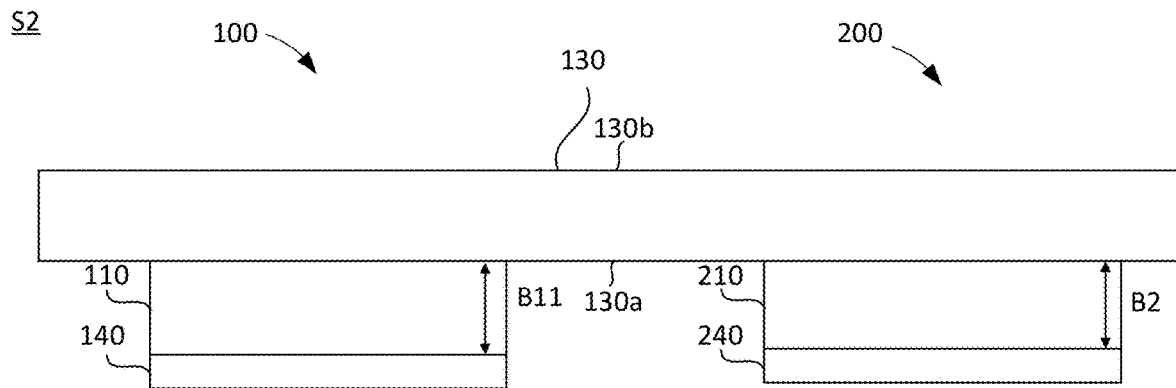

As illustrated in FIGS. 11 and 12B, in step S2, first passivation layer 140 of first resonator 100 is deposited on first electrode 110 of first resonator 100, and first passivation layer 240 of second resonator 200 is deposited on first electrode 210 of second resonator 200.

Figure 12C:
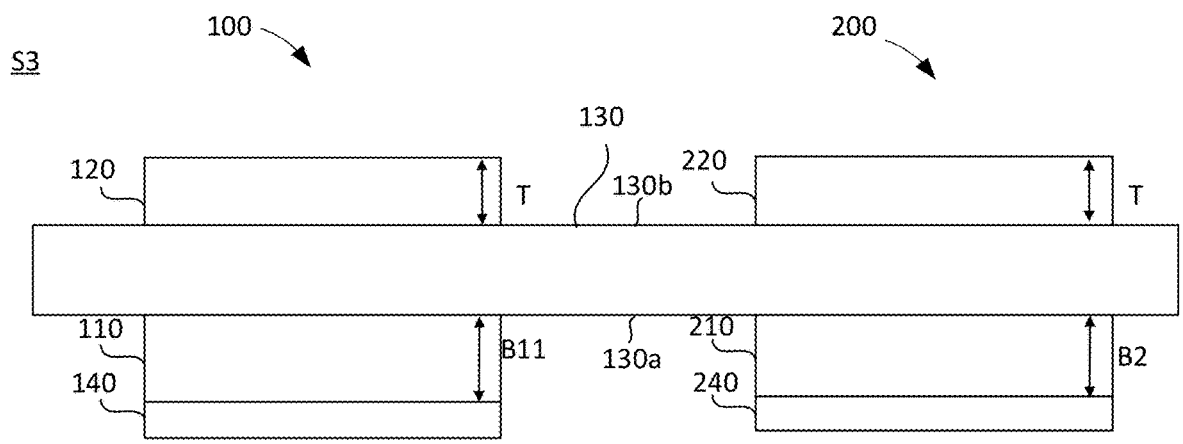

As illustrated in FIGS. 11 and 12C, in step S3, second electrode 120 of first resonator 100 and second electrode 220 of second resonator 200 are formed on second surface 130b of piezoelectric layer 130. Second electrodes 120 and 220 may be formed of the same thickness T.

As illustrated in FIG. 11, in step S510, a first RF performance test is conducted on the FBAR filter device to obtain a first measured value of an RF parameter of the FBAR filter device. In one embodiment, the RF performance test may be a frequency response test, and the RF parameter may be a frequency bandwidth in a frequency response curve obtained through the frequency response test.

Figure 12D:
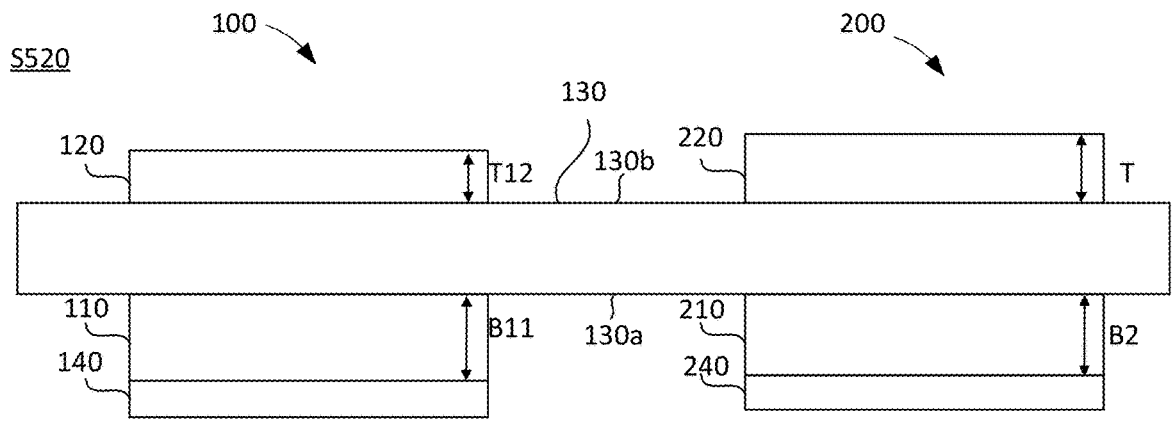

As illustrated in FIGS. 11 and 12D, in step S520, according to the results obtained through the RF performance test conducted in step S510, a thickness difference ΔT between an actual thickness T and a desired thickness T12 of second electrode 120 of first resonator 100, namely, ΔT=T−T12, is calculated. Then, the thickness of second electrode 120 is adjusted by ion beam trimming (IBT), so that the thickness changes from T to T12 (e.g., T11≤T12<T).

Figure 12E:
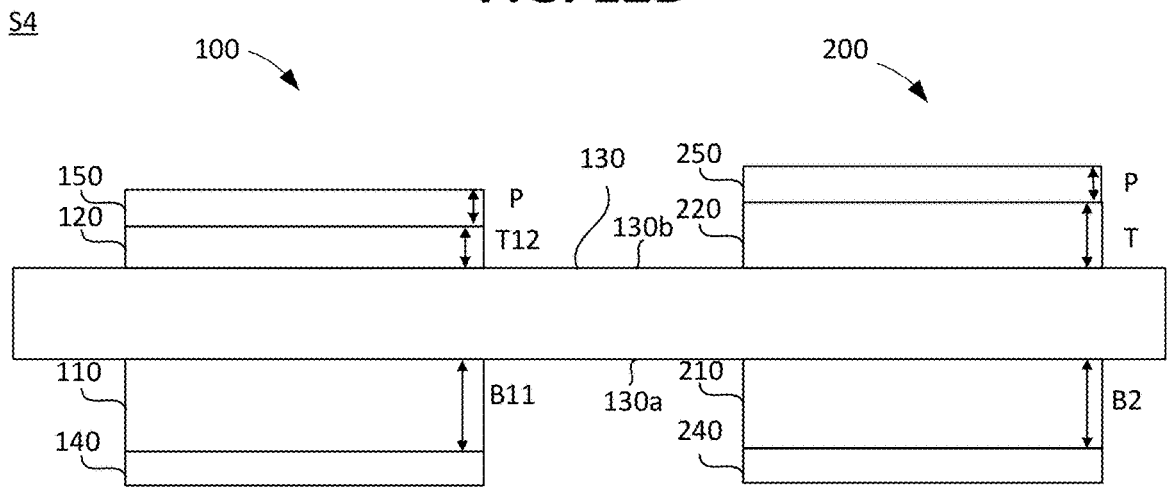

As illustrated in FIGS. 11 and 12E, in step S4, second passivation layer 150 of first resonator 100 is formed on second electrode 120 of first resonator 100, and second passivation layer 250 of second resonator 200 is formed on second electrode 220 of second resonator 200. Second passivation layers 150 and 250 may be formed of the same thickness P.

As illustrated in FIG. 11, in step S910, a second RF performance test is conducted on the FBAR filter device to obtain a second measured value of the RF parameter of the FBAR filter device. Similar to the above embodiments, the second RF performance test may be a frequency response test, and the RF parameter may be the frequency bandwidth (b−a) in a frequency response curve obtained through the frequency response test.

Figure 12F:
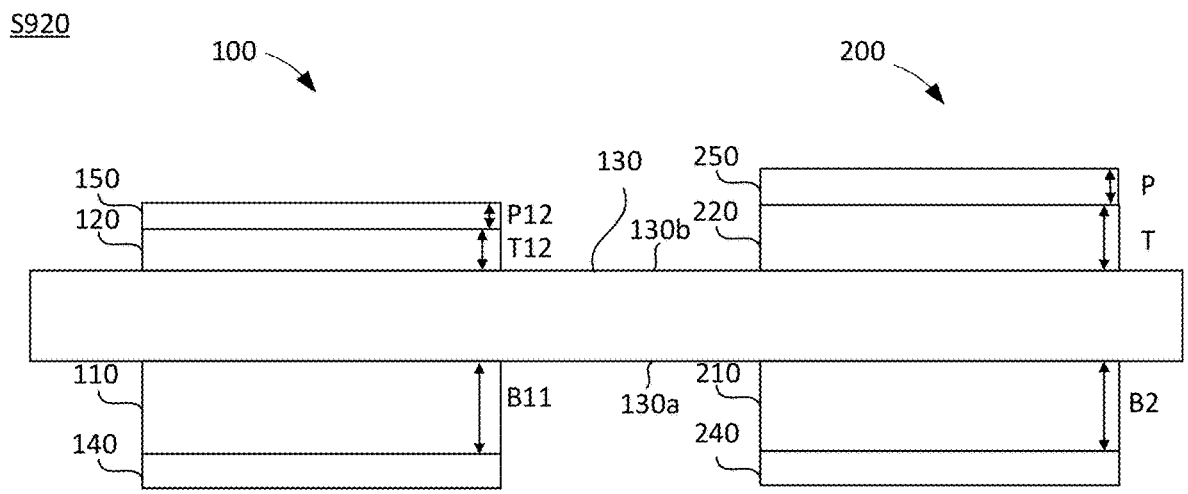

As illustrated in FIGS. 11 and 12F, in step S920, according to the results obtained through the second RF performance test conducted in step 910, a thickness difference ΔP between an actual thickness P and a desired thickness P12 of second passivation layer 150 of first resonator 100, namely, ΔP=P−P12, is calculated. Then, the thickness of second passivation layer 150 is adjusted by means of IBT, so that the thickness changes from P to P12 (e.g., P11<P12<P).

After the deposition of second passivation layers 150 and 250, the RF performance parameters of filter device 15 may vary slightly. In process 1100, the second RF performance test is conducted after forming second passivation layers 150 and 250, the desired thickness P12 of second passivation layer 150 of first resonator 100 is calculated according to the result of the second RF performance test, and then the thickness of second passivation layer 150 is adjusted to achieve the desired thickness P12. As a result, the performance of filter device 15, as well as wafer uniformity, are improved.

Compared with process 300 described with references to FIGS. 3 and 4A-4F, by using process 1100, the electrodes on one side of the filter device (e.g., first electrodes 110 and 210), and the electrodes and passivation layers on the other side of the filter device (e.g., second electrodes 120 and 220, and second passivation layers 150 and 250), are formed to have different thicknesses for different resonators. Thus, the desired thickness T12 of second electrode 120 and the desired thickness P12 of second passivation layer 150 may be determined and adjusted based on the results of RF performance tests. As a result, the two-step approach of process 1100 more precisely improves the performance and consistency of first and second resonators 100 and 200 and the filter devices formed across the entire wafer, and wafer yield rate may be enhanced.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

The invention claimed is:

1. A method for fabricating a film bulk acoustic resonator (FBAR) filter device including at least a first resonator and a second resonator, the method comprising:
    determining a simulation target thickness of each one of a first electrode of the first resonator and a first electrode of the second resonator based on a target performance parameter of the FBAR filter device;
    forming the first electrode of the first resonator and the first electrode of the second resonator on a first surface of a piezoelectric layer, wherein the forming includes:
        forming the first electrode of the first resonator with a thickness that is greater than the simulation target thickness of the first electrode of the first resonator; and
        forming the first electrode of the second resonator with a thickness that is the same as the simulation target thickness of the first electrode of the second resonator;
    forming a first passivation layer of each one of the first resonator and the second resonator on a corresponding one of the first electrode of the first resonator and the first electrode of the second resonator;
    forming a second electrode of each one of the first resonator and the second resonator on a second surface of the piezoelectric layer, the second surface being opposite to the first surface;
    conducting a radio frequency (RF) performance test on the FBAR filter device;
    adjusting a thickness of the second electrode of the first resonator based on a result of the RF performance test; and
    forming a second passivation layer of each one of the first resonator and the second resonator on a corresponding one of the second electrode of the first resonator and the second electrode of the second resonator.

2. The method of claim 1, wherein the RF performance test is a first RF performance test, and after forming the second passivation layer of each one of the first resonator and the second resonator, the method further comprises:
    conducting a second RF performance test on the FBAR filter device; and
    adjusting a thickness of the second passivation layer of the first resonator based on the result of the second RF performance test.

3. The method of claim 1, wherein the first electrode and the second electrode of each one of the first resonator and the second resonator are formed of an electrically conductive material including at least one of molybdenum (Mo), aluminum (Al), copper (Cu), platinum (Pt), tantalum (Ta), tungsten (W), palladium (Pd), ruthenium (Ru), or a stacked combination of two or more of those materials.

4. The method of claim 1, wherein the first passivation layer and the second passivation layer of each one of the first resonator and the second resonator are formed of a non-conductive material including at least one of silicon nitride (SiN) or aluminum nitride (AlN).

5. The method of claim 1, wherein the forming the second electrode of each one of the first resonator and the second resonator includes:
    forming the second electrode of the first resonator with a same thickness as the second electrode of the second resonator.

6. The method of claim 1, wherein
    the conducting the RF performance test on the FBAR filter device includes:
        obtaining a first measured value of an RF parameter of the FBAR filter device, and
    the adjusting the thickness of the second electrode of the first resonator based on the first measured value includes:
        determining a difference between the first measured value and a simulation target value of the RF parameter;
        determining a difference between an actual thickness and a desired thickness of the second electrode of the first resonator, based on the difference between the first measured value and the simulation target value of the RF parameter; and
        adjusting the thickness of the second electrode of the first resonator based on the difference between the desired thickness and the actual thickness of the second electrode of the first resonator.

7. The method of claim 6, wherein the RF parameter of the FBAR filter device includes a frequency response bandwidth.

8. The method of claim 1, wherein the forming the second passivation layer of each one of the first resonator and the second resonator includes:
    forming the second passivation layer of the first resonator with a same thickness as the second passivation layer of the second resonator.

9. The method of claim 2, wherein
    the conducting the second RF performance test on the FBAR filter device includes:
        obtaining a second measured value of the RF parameter of the FBAR filter device, and
    the adjusting the thickness of the second passivation layer of the first resonator based on the second measured value includes:
        determining a difference between the second measured value and a simulation target value of the RF parameter;
        determining a difference between a desired thickness and an actual thickness of the second passivation layer of the first resonator, based on the difference between the second measured value and the simulation target value of the RF parameter; and
        adjusting the thickness of the second passivation layer of the first resonator based on the difference between the desired thickness and the actual thickness of the second passivation layer of the first resonator.

10. A method for fabricating a film bulk acoustic resonator (FBAR) filter device including at least a first resonator and a second resonator, the method comprising:

determining a simulation target thickness of each one of a first electrode of the first resonator and a first electrode of the second resonator based on a target performance parameter of the FBAR filter device;
forming the first electrode of the first resonator and the first electrode of the second resonator on a first surface of a piezoelectric layer, wherein the forming includes:
 forming the first electrode of the first resonator with a thickness that is greater than the simulation target thickness of the first electrode of the first resonator; and
 forming the first electrode of the second resonator with a thickness that is the same as the simulation target thickness of the first electrode of the second resonator;
forming a first passivation layer of each one of the first resonator and the second resonator on a corresponding one of the first electrode of the first resonator and the first electrode of the second resonator;
forming a second electrode of each one of the first resonator and the second resonator on a second surface of the piezoelectric layer, the second surface being opposite to the first surface;
forming a second passivation layer of each one of the first resonator and the second resonator on a corresponding one of the second electrode of the first resonator and the second electrode of the second resonator;
conducting a radio frequency (RF) performance test on the FBAR filter device; and
adjusting a thickness of the second passivation layer of the first resonator based on a result of the RF performance test.

11. The method of claim 10, wherein
the conducting the RF performance test on the FBAR filter device includes:
 obtaining a measured value of an RF parameter of the FBAR filter device.

12. The method of claim 11, wherein
the adjusting the thickness of the second passivation layer of the first resonator based on the measured value includes:
 determining a difference between the measured value and a simulation target value of the RF parameter;
 determining a difference between a desired thickness and an actual thickness of the second passivation layer of the first resonator, based on the difference between the measured value and the simulation target value of the RF parameter; and
 adjusting the thickness of the second passivation layer of the first resonator based on the difference between the desired thickness and an actual thickness of the second passivation layer of the first resonator.

13. The method of claim 10, wherein the first electrode and the second electrode of each one of the first resonator and the second resonator are formed of an electrically conductive material including at least one of molybdenum (Mo), aluminum (Al), copper (Cu), platinum (Pt), tantalum (Ta), tungsten (W), palladium (Pd), ruthenium (Ru), or a stacked combination of two or more of those materials.

14. The method of claim 10, wherein the first passivation layer and the second passivation layer of each one of the first resonator and the second resonator are formed of a non-conductive material including at least one of silicon nitride (SiN) or aluminum nitride (AlN).

15. The method of claim 10, wherein the forming the second electrode of each one of the first resonator and the second resonator includes:
 forming the second electrode of the first resonator with a same thickness as the second electrode of the second resonator.

16. The method of claim 11, wherein the RF parameter of the FBAR filter device includes a frequency response bandwidth.

* * * * *